(12) United States Patent
Miyaji (10) Patent No.: US 11,309,135 B2
(45) Date of Patent: Apr. 19, 2022

(54) CERAMIC PACKAGE

(71) Applicant: NGK SPARK PLUG CO., LTD., Nagoya (JP)

(72) Inventor: Takayuki Miyaji, Nagoya (JP)

(73) Assignee: NGK SPARK PLUG CO., LTD., Nagoya (JP)

(*) Notice: Subject to any disclaimer, the term of this patent is extended or adjusted under 35 U.S.C. 154(b) by 433 days.

(21) Appl. No.: 16/659,902

(22) Filed: Oct. 22, 2019

(65) Prior Publication Data

US 2020/0227207 A1 Jul. 16, 2020

(30) Foreign Application Priority Data

Jan. 11, 2019 (JP) .............................. JP2019-003018
May 8, 2019 (JP) .............................. JP2019-088105

(51) Int. Cl.
*H01G 9/008* (2006.01)
*H01G 9/08* (2006.01)
*H01G 11/74* (2013.01)
*H01G 11/82* (2013.01)

(52) U.S. Cl.
CPC .............. *H01G 9/008* (2013.01); *H01G 9/08* (2013.01); *H01G 11/74* (2013.01); *H01G 11/82* (2013.01)

(58) Field of Classification Search
CPC .......... H01G 11/82; H01G 9/008; H01G 9/08; H01G 11/74
See application file for complete search history.

(56) References Cited

U.S. PATENT DOCUMENTS

2012/0092809 A1* 4/2012 Tamachi ................ H01G 11/74
361/502
2013/0294012 A1* 11/2013 Mano ................... H01M 10/049
361/517
2016/0133894 A1* 5/2016 Onodera ............. H01M 50/202
429/163

FOREIGN PATENT DOCUMENTS

JP   H10-41431 A   2/1998

* cited by examiner

*Primary Examiner* — Eric W Thomas
(74) *Attorney, Agent, or Firm* — Stites & Harbison, PLLC; Jeffrey A. Haeberlin (57) ABSTRACT

Disclosed is a ceramic package for filling with a liquid-containing electrolyte, which includes: a package body defining a recessed cavity open at a front surface of the package body and including first and second ceramic layers stacked together; a plurality of electrode pads disposed on a bottom surface of the recessed cavity; and a plurality of outer connection terminals disposed on a back surface of the package body, wherein each of the electrode pads includes a pad body portion having a polygonal shape in plan view and an interlayer pad portion formed along an interlayer surface between the first and second ceramic layers, wherein the interlayer pad portion has a protruding part protruding outwardly from the pad body portion, and wherein via conductors are formed between the protruding parts of the electrode pads and the outer connection terminals through the first ceramic layer.

7 Claims, 4 Drawing Sheets

CERAMIC PACKAGE

BACKGROUND

The present invention relates to a ceramic package for filling with a liquid-containing electrolyte, particularly of the type having a multilayer ceramic package body formed with a recessed cavity and via conductors respectively connecting a plurality of electrode pads on a bottom surface of the recessed cavity to a plurality of outer connection terminals on a back surface of the package body and being capable of, when the recessed cavity is filled with the electrolyte, preventing or suppressing corrosion of the via conductors and the like by the electrolyte.

Japanese Laid-Open Patent Publication No. HIO-41431 (Pages 1 to 4 and FIG. 1 to 6) proposes a hermetically-sealable package that includes: a box-shaped package body having a plurality of ceramic layers stacked together and defining therein a recessed cavity open at a front surface of the package body; inner electrodes disposed on a bottom surface of the recessed cavity of the package body; outer electrodes disposed on a back surface of the package body; and conductor lines formed through some of the ceramic layers closer to the back surface than the bottom surface and respectively connecting the inner electrodes to the outer electrodes. This proposed package is advantageous in that: the propagation of stress from the outside to the inner electrodes is absorbed so as to reduce distortion of an electronic component (such as capacitor or quartz element) mounted to the inner electrodes; and the parts count, manufacturing labor and cost of the package is reduced, without the need to use a conventional holding support, and is available as a thin-type product.

It is conceivable to utilize the hermetically-sealable package as a battery or electrochemical cell by mounting an electronic component (such as capacitor) to the inner electrodes of the package, filling a liquid or gel-like electrolyte into a space around the electronic component within the cavity of the package body and then hermetically sealing the cavity of the package. In the above-disclosed type of hermetically-sealable package, it is often the case that a thin layer of gold is applied to respective exposed surfaces the inner electrodes via a thin layer of nickel. When the electrolyte is brought into contact with the metal material of the inner electrode from these thin metal layers, metal corrosion may start from the inner electrode and reach the outer electrode through the conductor lines. There thus arises a problem that, with the development of such metal corrosion, a leak path may occur in an interlayer conductor between the ceramic layers so as to thereby cause a deterioration of the hermeticity between the inside and outside of the cavity of the package body. There also arises a problem that, when the interlayer conductor is broken with the development of the metal corrosion, a poor conduction is caused due to the interruption of electrical connection to the outer electrode.

SUMMARY

The present invention has been made in view of the above-mentioned problems. One main advantage of the present invention is to provide a ceramic package for filling with a liquid-containing electrolyte, which is capable of, when a recessed cavity of the package body is filled with the electrolyte, preventing corrosion of metallic conductive parts by the electrolyte from developing outwardly from the recessed cavity.

According to one aspect of the present invention, there is provided a ceramic package for filling with a liquid-containing electrolyte, comprising: a package body having opposite front and back surfaces and defining therein a recessed cavity open at the front surface of the package body to be filled with the liquid-containing electrolyte, the package body comprising a plurality of ceramic layers including first and second ceramic layers stacked together, the first ceramic layer being located closer to the back surface of the package body than the second ceramic layer, an interlayer surface between the first and second ceramic layers being defined along an extension of a bottom surface of the recessed cavity in a plane direction; a plurality of electrode packages disposed on the bottom surface of the recessed cavity and the interlayer surface between the first and second ceramic layers; a plurality of outer connection terminals disposed on the back surface of the package body; and via conductors extending through at least the first ceramic layer and respectively connecting the electrode pads to the outer connection terminals, wherein each of the electrode pads includes a pad body portion having a polygonal shape in plan view and an interlayer pad portion formed along the interlayer surface between the first and second ceramic layers such that a boundary of the pad body portion and the interlayer pad portion is positioned at the interlayer surface between the first and second ceramic layers, wherein the interlayer pad portion has a protruding part protruding outwardly from the pad body portion in plan view, and wherein the via conductors are formed between the protruding parts of the electrode pads and the outer connection terminals through at least the first ceramic layer.

The other objects and features of the present invention will also become understood from the following description.

DETAILED DESCRIPTION

Hereinafter, exemplary embodiments of the present invention will be described in detail below with reference to the drawings.

Figure 1A:
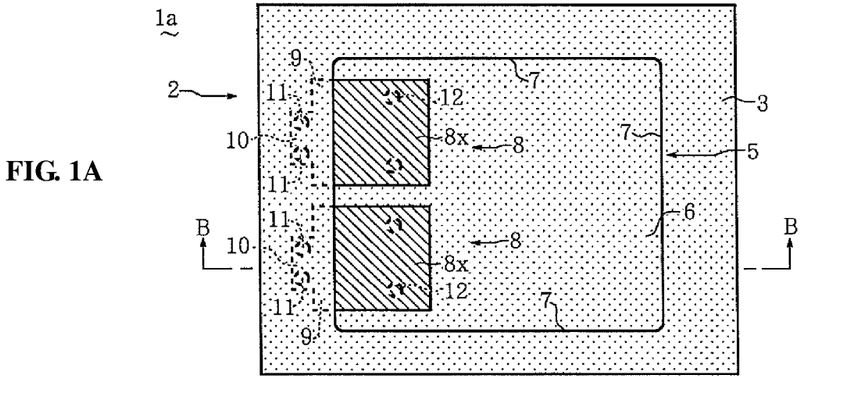
FIG. 1A is a plan view of a ceramic package according to one embodiment of the present invention.
Figure 1B:
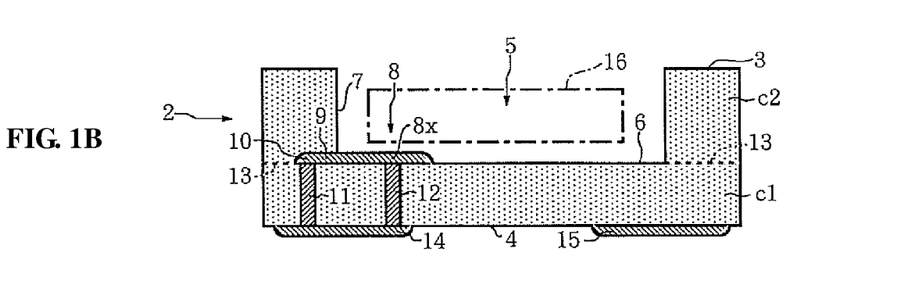
FIG. 1B is a cross-sectional view of the ceramic package as taken along line B-B of FIG. 1A.
Figure 1C:
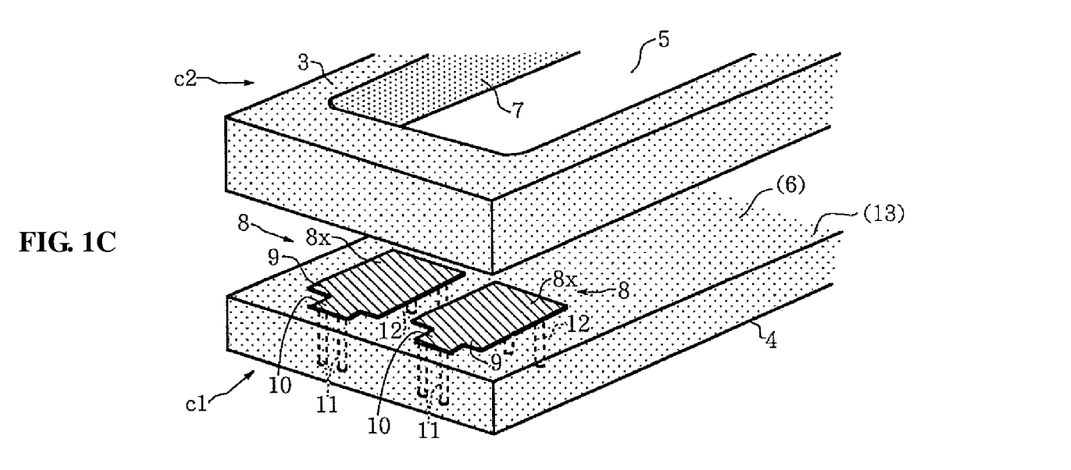
FIG. 1C is an exploded perspective view of main part of the ceramic package.

FIG. 1A is a plan view of a ceramic package 1a for filling with a liquid-containing electrolyte according to one embodiment of the present invention; FIG. 1B is a cross-sectional view of the ceramic package 1a as taken along line B-B of FIG. 1A; and FIG. 1C is an exploded perspective view of main part of the ceramic package 1a. As shown in FIGS. 1A to 1C, the ceramic package 1a includes a package body 2 having opposite front and back surfaces 3 and 4 and defining therein a recessed cavity 5 open at the top surface 3 to be filled with the electrolyte. In the present embodiment, the package body 2 is rectangular in outer shape when viewed in plan. The recessed cavity 5 has a bottom surface 6 rectangular in plan view and side surfaces 7 extending from four sides of the bottom surface 6. The ceramic package 1a further includes: a pair of (a plurality of) electrode pads 8 disposed adjacent each other on an end region of the bottom surface 6 along one short-side side surface 7 (left side in FIG. 1A); and a pair of (a plurality of) outer connection terminals 14 disposed on an end region of the back surface 4 at positions corresponding to the electrode pads 8. Herein, the outer connection terminals 14 are arranged in a direction orthogonal to the paper surface of FIG. 1B. Dummy pads 15, which are used for mounting of the ceramic package 1a, are disposed electrically independently on an end region of the back surface 4 (right side in FIG. 1B) opposite from the outer connection terminals 14.

As shown in FIGS. 1B and 1C, the package body 2 has a plurality of (at least two) ceramic layers stacked together and including a flat back-surface-side ceramic layer c1 (as a first ceramic layer) and a rectangular frame-shaped front-surface-side ceramic layer c2 (as a second ceramic layer) located on a front peripheral side of the ceramic layer 1c, with an interlayer surface 13 between these ceramic layers c1 and c2 being defined along an extension of the bottom surface 6 in a plane direction.

In the present embodiment, the ceramic layers c1 and c2 are composed of e.g. alumina.

Each of the electrode pads 8 includes: a pad body portion 8x formed in a rectangular shape in plan view; and an interlayer pad portion 9 formed at the interlayer surface 13 between the ceramic layers c1 and c2. The interlayer pad portion 9 has a protruding part 10 rectangular in shape and protruding outwardly from the pad body portion 8x in plan view. In other words, the electrode pad 8 is situated astride the bottom surface 6 of the recessed cavity 5 and the interlayer surface 13 extending from the bottom surface 6 in the plane direction. A boundary of the pad body portion 8x and the interlayer pad portion 9 is positioned at the interlayer surface 13 between the ceramic layers c1 and c2. When viewed in plan, a width of the protruding part 10 is smaller than a width of the interlayer pad portion 9 except the protruding part 10 so that corners of the interlayer pad portion 9 are located on both sides of the protruding part 10 in a width direction. The term "width direction" as used herein refers to a direction orthogonal to the direction of protrusion of the protruding part 10.

As shown in FIGS. 1A and 1B, the ceramic package 1a also includes: two via conductors 11 separately formed through the ceramic layer 1c between the protruding part 10 and the outer connection terminal 14; and another two via conductor 12 separately formed through the ceramic layer 1c between the pad electrode body 8x (more specifically, a part of the pad body portion 8x located on the bottom surface 6 of the recessed cavity 5) and the outer connection terminal 14. The number of via conductors 11, 12 is however not particularly limited to two. Any arbitrary number of via conductors 11, 12, for example, one via conductor 11, 12 or three or more via conductors 11, 12, can be provided for each pair of electrode pad 8 and outer connection terminal 14.

In the present embodiment, the electrode pads 8, the via conductors 11 and 12, the outer connection terminals 14 and the dummy pads 15 are mainly composed of tungsten (W), molybdenum (Mo) or the like.

Further, both of via conductors 11 and 12 are circular in cross section in the present embodiment. When the via conductors 11 have a circular cross section of 50 μm diameter, for example, the protruding part 10 protrudes outwardly by an amount of at least 100 μm or more from both outer peripheral edges of the interlayer pad portion 9; and the via conductors 11 are connected to the protruding part 10 at positions of at least 50 μm or more inside from both side edges of the protruding part 10 in the width direction and from an outer end edge of the protruding part 10.

Although not specifically shown in the drawings, a thin layer of gold (Au) etc. is applied to respective exposed surfaces of the pad body portions 8x, the outer connection terminals 14 and the dummy pads 15 via a nickel layer.

An electronic component 16 such as capacitor is mounted to the exposed parts of the electrode pads 8 on the bottom surface 6 of the recessed cavity 5 as shown by a dashed line in FIG. 1B.

A space around the electronic component 16 within the recessed cavity 5 is filled with the liquid-containing electrolyte.

When the space around the electronic component 16 within the recessed cavity 5 is filled with the liquid-containing electrolyte, there is a case that the liquid-containing electrolyte may flow out outwardly (in plan view) along the outer peripheral edges of the interlayer pad portion 9 through a minute clearance between the interlayer surface 13 and the outer peripheral edges of the interlayer pad portion 9.

In the present embodiment, however, the ceramic package 1a is so configured that: the boundary of the pad body portion 8x and the interlayer pad portion 9 is positioned at the interlayer surface 13 between the ceramic layers c1 and c2; and, when viewed in plan, the protruding part 10 as a part of the interlayer pad portion 9 of the electrode pad 8 protrudes outwardly from the pad body portion 8x such that the interlayer surface 13 at which the ceramic layer c1 and c2 are in close contact with each other is situated on both sides of the protruding part 10 in the width direction. In such a configuration, the interlayer edge portion 9 is L-shaped in plan view, whereby the path of entry of the electrolyte is made longer. This makes it unlikely that the electrolyte will reach the via conductors 11, which are connected at one ends thereof to the protruding part 10. The via conductors 11 are thus prevented from deterioration such as corrosion by the electrolyte. Even if the via conductor 12 is corroded by the electrolyte, the via conductor 11 is suppressed or prevented from corrosion by the electrolyte. Accordingly, the ceramic package 1a maintains stable electrical connection between the electrode pads 8 and the outer connection terminals 14. (The aforementioned effect is hereinafter referred to as "effect (1)".)

Furthermore, the package body 2 is rectangular in plan view; and, in plan view of the electrode pad 8, the width of the protruding part 10 (which protrudes outwardly from the pad body portion 8x) is smaller than the width of the interlayer pad portion 9 (which extends adjacent to and integral with the pad body portion 8x) except the protruding part 10 in the present embodiment. As the interlayer surface 13 at which the ceramic layer c1 and c2 are in close contact with each other is located on both sides of the protruding part 10 in the width direction, the liquid-containing electrolyte in the recessed cavity 5 is prevented by the interlayer surface 13 from penetrating toward the protruding part 10. Even when the electrolyte flows along the outer peripheral edges of the interlayer pad portion 9, the path of entry of the electrolyte is made longer because of the L-shaped plan configuration of the interlayer pad portion 9. Thus, the effect (1) is more reliably obtained. In addition, the space required for arrangement of the protruding part 10 is made relatively small as the protruding part 10 is smaller in width than the interlayer pad portion 9 in the present embodiment as compared to the case where the protruding part is larger in width than the interlayer pad portion. This contributes to a size reduction of the ceramic package 1a. (The aforementioned effect is hereinafter referred to as "effect (2)".)

It is feasible to seal the inside of the recessed cavity 5 from the outside by e.g. previously applying a rectangular metallized layer (in plan view; not shown) to the front surface 3 of the package body 3, mounting the electronic component 16 over the pair of electrode pads 8, filling the electrolyte into the space around the electronic component within the recessed cavity 5, and then, joining a metal lid (not shown) to the metallized layer by welding or brazing.

In the present embodiment, four electrode pads 8 in total, two along one short-side side surface 7 and the other two along the other short-side side surface 7, may be provided symmetrically. In this case, the via conductors 11 and 12 and the outer connection terminals 14 are provided as mentioned above corresponding to the respective four electrode pads 8.

Figure 2A:
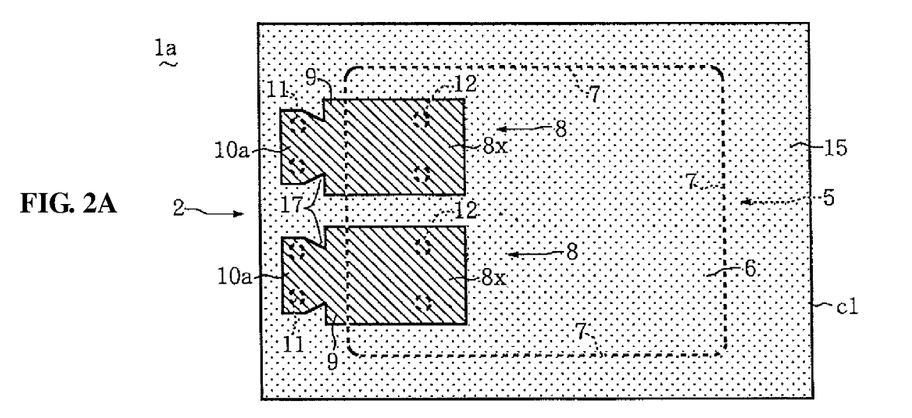
FIGS. 2A to 2C are plan views of a first ceramic layer of the ceramic package, showing different forms of electrode pads.

FIG. 2A is a plan view of the back-surface-side ceramic layer 1c of the ceramic package 1a, showing a modified form of protruding part 10a provided as a part of the interlayer pad portion 9 of the electrode pad 8. As shown in FIG. 2A, a pair of recessed sections 17 of triangular plan shape are formed symmetrically in the interlayer pad portion 9 of the electrode pad 8 on both sides of the protruding part 10a in the width direction. The protruding part 10a thus has a trapezoid-like shape whose wide base side is located opposite from the pad body portion 8x when viewed in plan. It can also be said that the protruding part 10a has a deformed polygonal shape defined by forming inclined faces symmetrically on two corners of the rectangular plan shape. As in the above embodiment, two via conductors 11 are formed between the protruding part 10a and the outer connection terminal 14; and two via conductors 12 are formed between the pad body portion 8x and the outer connection terminal 14.

Figure 2B:
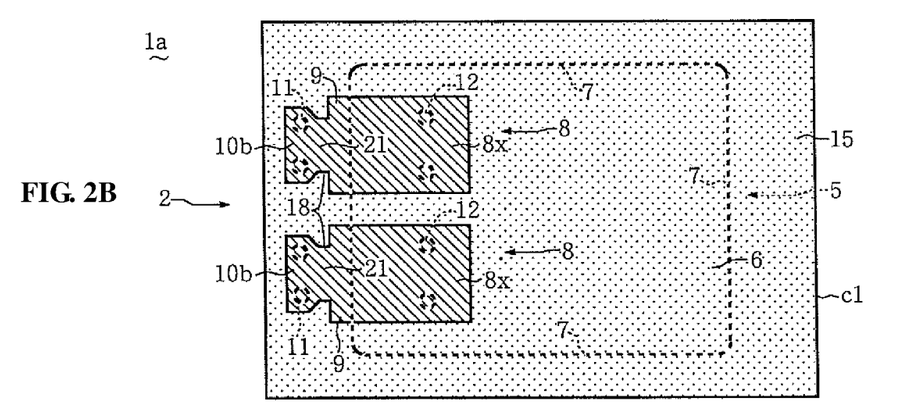

FIG. 2B is a plan view of the back-surface-side ceramic layer 1c of the ceramic package 1a, showing another modified form of protruding part 10b provided as a part of the interlayer pad portion 9 of the electrode pad 8. As shown in FIG. 2B, a pair of recessed sections 18 of trapezoid-like plan shape are formed symmetrically in the interlayer pad portion 9 of the electrode pad 8 on both sides of the protruding part 10b in the width direction. The protruding part 10b thus has a trapezoid-like (deformed polygonal) shape whose wide side is located opposite from the pad body portion 8x and which is connected to the pad body portion 8x via a narrow neck section 21 between the recessed sections 18. As in the above embodiment, two via conductors 11 are formed between the protruding part 10b and the outer connection terminal 14; and two via conductors 12 are formed between the pad body portion 8x and the outer connection terminal 14.

Figure 2C:
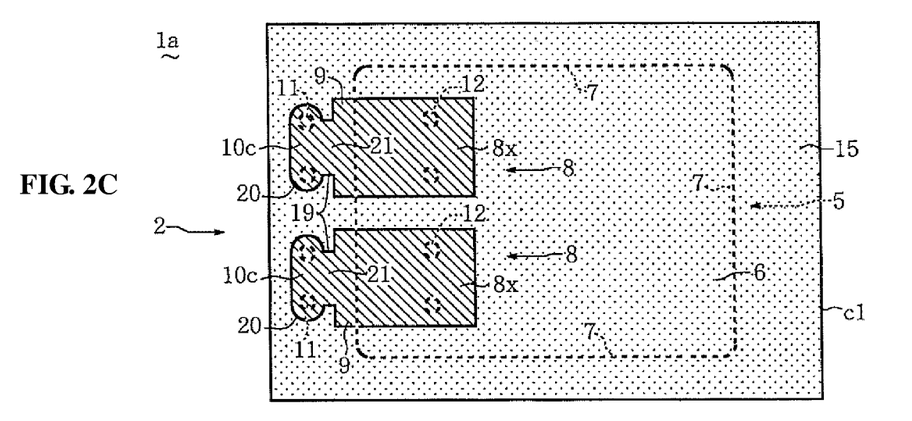

FIG. 2C is a plan view of the back-surface-side ceramic layer 1c of the ceramic package 1a, showing still another modified form of protruding part 10c provided as a part of the interlayer pad portion 9 of the electrode pad 8. As shown in FIG. 2C, a pair of recessed sections 19 of rectangular plan shape are formed symmetrically in the interlayer pad portion 9 of the electrode pad 8 on both sides of the protruding part 10a in the width direction. The protruding part 10a thus has a T shape when viewed in plan. More specifically, the protruding part 10a has a linear section 20 of elongated ellipse shape which is parallel with the side surface 7 of the recessed cavity 5 closest to the protruding part 10a and a neck section 21 which is defined between the recessed section 18 at a position closer to the pad body portion 8x than the linear section 20. As in the above embodiment, two via conductors 11 are formed between the outer connection terminal 14 and both ends of the linear section 20 of the protruding part 10c; and two via conductors 12 are formed between the outer connection terminal 14 and the pad body portion 8x.

Even when the protruding part 10a, 10b, 10e of the electrode pad 8 (interlayer pad portion 9) is formed in the above-mentioned shape, the ceramic package 1a is so configured that: the protruding part 10a, 10b, 10c protrudes outwardly in plan view; and the interlayer pad portion 9 is situated at the interlayer surface 13 by which the recessed sections 17, 18, 19 are defined (corresponding to the boundary of the interlayer pad portion 9 and the pad body portion 8x) and at which the ceramic layer c1 and c2 are in close contact with each other. Thus, the path of entry of the electrolyte from the recessed cavity 5 toward the protruding part 10a along the outer peripheral edges of the interlayer pad portion 9 is made further longer. This makes it unlikely that the electrolyte will reach the via conductors 11, which are connected at one ends thereof to the protruding part 10a, 10b, 10c. Furthermore, the protruding part 10a, 10b, 10c is smaller in width than the interlayer pad portion 9. The effects (1) and (2) are therefore more reliably obtained even in the above modified examples.

Figure 3A:
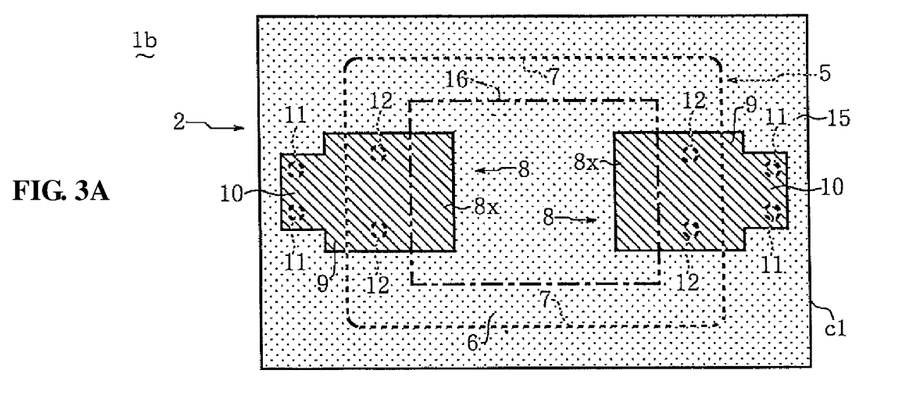
FIGS. 3A to 3C are plan views of first ceramic layers of ceramic packages according to other embodiments of the present invention.

FIG. 3A is a plan view of a base-surface-side ceramic layer 1c of a ceramic package 1b according to another modified embodiment of the present invention. As shown in FIG. 3A, the ceramic package 1b includes: a package body 2 similar to that of the above embodiment; a pair of (a plurality of) electrode pads 8 disposed symmetrically along the opposite short-side side surfaces 7 of the recessed cavity 5. As in the above embodiment, each of the electrode pads 8 of the ceramic package 1b includes: a pad body portion 8x situated astride the bottom surface 6 of the recessed cavity 5 and the interlayer surface 13 between the ceramic layers c1 and c2; and an interlayer pad portion 9 positioned at the interlayer surface 13 between the ceramic layers c1 and c2 and having a protruding part 10 protruding outwardly from the pad body portion 8x in plan view. Outer connection terminal 14 (not specifically shown in FIG. 3A) are disposed on both end sides of the bottom surface 4 of the package body 2 at positions corresponding to and overlapping the electrode pads 8. Two via conductors 11 are formed separately between the outer connection terminal 14 and the protruding part 10 of the electrode pad 8. Two via conductors 12 are formed separately formed between the outer connection terminal 14 and the pad body portion 8x of the electrode pad 8 (more specifically, a part of the pad body portion 8x located on the bottom surface 6 of the recessed cavity 5). As shown by a dashed line in FIG. 3A, an electronic component 16 is mounted over the pad body portions 8x of the electrode pads 8 within the recessed cavity 5. Even in this configuration, the effects (1) and (2) are reliably obtained.

Figure 3B:
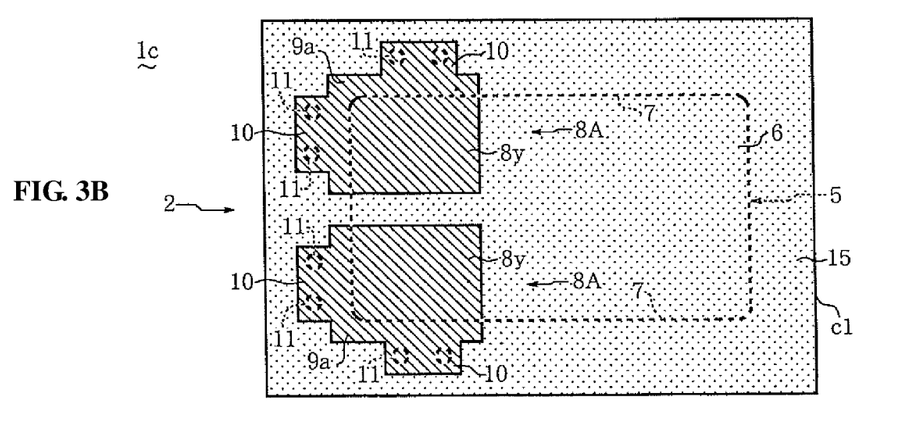

FIG. 3B is a plan view of a base-surface-side ceramic layer 1c of a ceramic package 1c according to still another modified embodiment of the present invention. As shown in FIG. 3B, the ceramic package 1b includes: a package body 2 similar to that of the above embodiment; a pair of electrode pads 8A disposed symmetrically and each lying astride one of the short-side side surfaces 7 and either one of the long-side side surfaces 7 of the recessed cavity 5. Each of the electrode pads 8A includes: a pad body portion 8y formed in a rectangular shape in plan view and situated astride the bottom surface 6 of the recessed cavity 5 and the interlayer surface 13 between the ceramic layers c1 and c2; and an interlayer pad portion 9a formed in an L shape in plan view along short and long sides of the pad body portion 8y and positioned at the interlayer surface 13 between the ceramic layers c1 and c2. The interlayer pad portion 9a has a pair of protruding parts 10 respectively formed on center regions of short and long sides of the interlayer pad portion 9a and protruding outwardly from the pad body portion 8y along the interlayer surface 13. As shown in FIG. 3B, the pair of protruding parts 10 on each electrode pad 8A are directed perpendicular to each other. The protruding parts 10 are smaller in width than the short and long sides of the interlayer pad portion 9a from which the protruding portions 10 protrude, respectively. Outer connection terminal 14 (not specifically shown in FIG. 3B) are disposed on one end region of the bottom surface 4 of the package body 2 at positions corresponding to and overlapping the electrode pads 8A. Two via conductors 11 are formed between the outer connection terminal 14 and each of the protruding parts 10 of the electrode pad 8A. As shown by a dashed line in FIG. 3A, an electronic component 16 is mounted over the pad body portions 8y of the electrode pads 8 within the recessed cavity 5. Even in this configuration, the effects (1) and (2) are reliably obtained as in the above embodiment.

Although the arrangement of via conductors 12 in the ceramic package 1c is omitted, an arbitrary number of via conductors 12 may be provided as in the case of the ceramic package 1a, 1b. Further, four electrode pads 8A may be disposed separately and symmetrically at four corners of the recessed cavity 5 such that an electronic component 16 is mounted over the four electrode pads 8A on the bottom surface 6 of the recessed cavity 5.

Figure 3C:
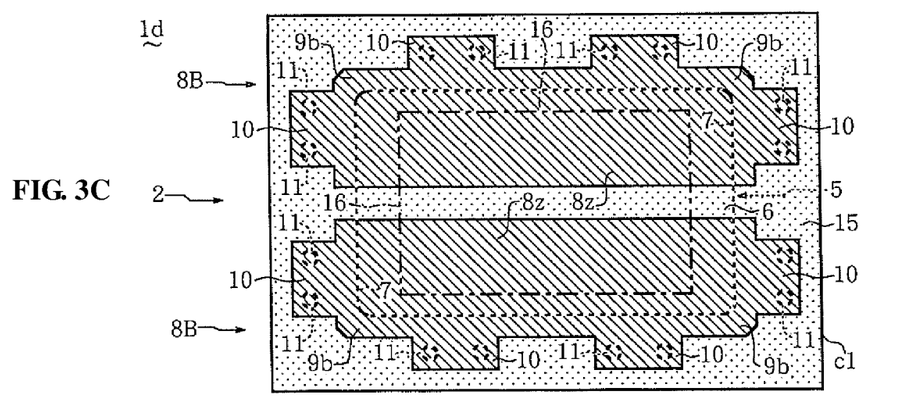

FIG. 3C is a plan view of a base-surface-side ceramic layer 1c of a ceramic package 1d according to still another embodiment of the present invention. As shown in FIG. 3C, the ceramic package 1d includes a package body 2 similar to that of the above embodiment; a pair of (a plurality of) electrode pads 8B disposed symmetrically along the opposite long-side side surfaces 7 of the recessed cavity 5. Each of the electrode pads 8B includes: a pad body portion 8z formed in an elongated rectangular shape in plan view and situated astride the bottom surface 6 of the recessed cavity 5 and the interlayer surface 13 between the ceramic layers c1 and c2 along the opposite long-side side surface 7; and an interlayer pad portion 9b formed along the pad body portion 8z so as to correspond to the entire length of the long-side side surface 7 and parts of the short-side side surfaces 7 and positioned at the interlayer surface 13 between the ceramic layers c1 and c2. The interlayer pad portion 9b has four protruding parts 10 in total, two on the long side and two on the respective opposite short side, spaced apart from each other and protruding outwardly in plan view. Outer connection terminal 14 (not specifically shown in FIG. 3C) are disposed on the bottom surface 4 of the package body 2 at positions corresponding to and overlapping the electrode pads 8A. Two via conductors 11 are formed between the outer connection terminal 14 and each of the protruding parts 10 of the electrode pad 8B. As shown by a dashed line in FIG. 3C, an electronic component 16 is mounted over the pad body portions 8z of the electrode pads 8 within the recessed cavity 5. Even in this configuration, the effects (1) and (2) are reliably obtained as in the above embodiments.

The protruding part 10 of the electrode pad 8, 8A, 8B in the ceramic package 1b, 1c, 1d may be replaced with any one of the above-mentioned protruding parts 10a, 10b and 10c. The effects (1) and (2) are also obtained even in this modified example.

Figure 4A:
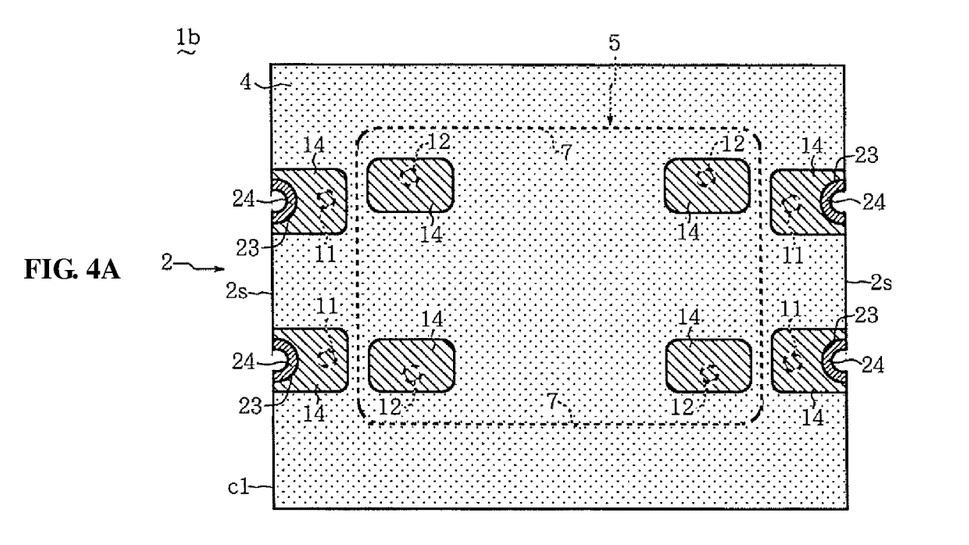
FIGS. 4A and 4B are bottom views of ceramic packages according to other embodiments of the present invention.

FIG. 4A is a bottom view of a modified example of the ceramic package 1b in which a plurality of outer connection terminals 14 are provided in a different arrangement. Although not specifically shown in FIG. 4A, a pair of electrode pads 8 are disposed symmetrically along the opposite short-side side surfaces 7 of the recessed cavity 5 in this modified example as in the above embodiment of FIG. 3A. As shown in FIG. 4A, total eight outer connection terminals 14, four on each short side, are disposed on the back surface 4 of the package body 2 at positions corresponding and opposed to the electrode pads 8 in the thickness direction such that four outer connection terminals 14 are connected to each of the electrode pads 8 via two via conductors 11 and two via conductors 12, respectively. Among others, four of the outer connection terminals 14 are located on a pair of two opposed side surfaces 2s of the package body 2 and have side-surface-side ends respectively connected to back-surface-side ends of side conductors 24. Herein, the side conductors 24 are made of the same metal material as the via conductors 11, 12 in a semi-cylindrical shape as a whole along inner wall surfaces of semi-circular cross section grooves 23 that are formed in the side surfaces of at least the ceramic layer 1c in the thickness direction. In this configuration, two or more outer connection terminals 14 are electrically connected to one electrode pad 8 as mentioned above. It thus becomes easy to connect the ceramic package 1b to a plurality of outer connection terminals on a motherboard etc. (to which the ceramic package 1b is mounted) or possible to make parallel connection of the ceramic package 1b and the motherboard etc. (The aforementioned effect is hereinafter referred to as "effect (3)".) Moreover, some outer connection terminals 14 are respectively connected to the side conductors 24. It thus becomes possible to ensure a wider area of solder joint to a plurality of electrodes on the motherboard etc. for more reliable connection strength between the ceramic package 1b and the motherboard etc. (The aforementioned effect is hereinafter referred to as "effect (4)".) Consequently, not only the effects (1) and (2) but also the effects (3) and (4) are obtained in this modified example.

The above arrangement configuration is also applicable to the ceramic package 1a, 1c or 1d.

Figure 4B:
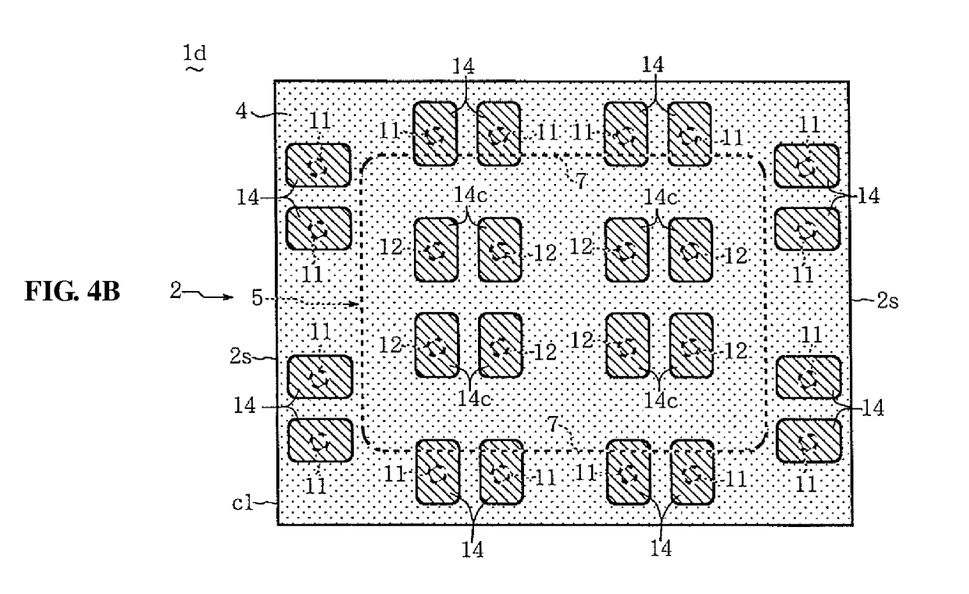

FIG. 4B is a bottom view of a modified example of the ceramic package 1d in which a plurality of outer connection terminals 14 and 14c are provided in a different arrangement. Although not specifically shown in FIG. 4B, a pair of electrode pads 8B electrode pads 8B are disposed symmetrically along the opposite long-side side surfaces 7 of the recessed cavity 5 in this modified example as in the above embodiment of FIG. 3C. As shown in FIG. 4B, total sixteen outer connection terminals 14, four on each side, are disposed on a peripheral region of the back surface 4 of the package body 2, at positions corresponding and opposed to the electrode pads 8B in the thickness direction, so as to be arranged in a rectangular frame shape as a whole when viewed in plan. These sixteen outer connection terminals 14 on the peripheral region of the back surface 4 are connected to the electrode pads 8B via respective via conductors 11. Further, eight outer connection terminals 14c are disposed on a center region of the back surface 4 of the package body 2, at positions corresponding and opposed to the electrode pads 8B in the thickness direction, so as to be arranged in a rectangular shape as a whole and surrounded by the above sixteen outer connection terminals when viewed in plan.

These eight outer connection terminals 14c on the center region of the back surface 4 are connected to the electrode pads 8 via respective via conductors 12. In this configuration, two or more outer connection terminals 14 are electrically connected to one electrode pad as mentioned above. In particular, these two or more outer connection terminals 14 are disposed on the peripheral region of the back surface 4 of the package body 2 in plan view. It thus becomes possible to allow relatively easy positioning of the ceramic package 1d at the time of mounting the ceramic package 1d to the motherboard etc. (The aforementioned effect is hereinafter referred to as "effect (5)".) Consequently, not only the effects (1), (2) and (3) but also the effect (5) are obtained in this modified example. In this modified example, one or more outer connection terminals 14c are also arranged on the center region of the back surface of the package body 2. The effect (3) is more remarkably obtained by the arrangement of such one or more outer connection terminals on the center region of the back surface 4.

The above arrangement configuration is also applicable to the ceramic package 1a, 1b or 1c.

As described above, the ceramic package 1a, 1b, 1c, 1d is advantageous in that, even when the recessed cavity 5 of the package body 2 is filled with the liquid-containing electrolyte, corrosion of the metal conductor part by the electrolyte is prevented from developing outwardly from the recessed cavity 5.

Although the present invention has been described above with reference to the specific embodiments and examples, the above-described embodiments and examples are intended to facilitate understanding of the present invention and are not intended to limit the present invention thereto. Various changes and modifications can be made to the above embodiments and examples without departing from the scope of the present invention.

The material of the ceramic layers c1 and c2 is not limited to alumina. As the material of the ceramic layers c1 and c1, there can be used high-temperature co-fired ceramic such as not only alumina but also mullite, aluminum nitride or the like, or low-temperature co-fired ceramic such as glass-ceramic composite. When the ceramic layers c1 and c2 are composed of high-temperature co-fired ceramic, tungsten (W), molybdenum (Mo) or the like can be used as the material of the conductor parts such as electrode pads 8, via conductors 11, 12, outer connection terminals 14 and the like. When the ceramic layers c1 and c2 are composed of low-temperature co-fired ceramic, copper (Cu), silver (Ag) or the like can be used as the material of the conductor parts such as electrode pads 8, via conductors 11, 12, outer connection terminals 14 and the like.

The outer shape of the package body 2 (front and back surfaces 3 and 4) and the shape of the recessed cavity 5 are not particularly limited. The front and back surface 3 and 4 of the package body 2 may alternatively have a substantially square outer shape in plan view. The bottom surface 6 of the recessed cavity 5 may alternatively have a substantially square shape in plan view. Even in these cases, two (a pair of) or four electrode pads 8, 8A, 8B are applicable as in the above embodiments.

Although the pad body portions 8x, 8y and 8z of the electrode pad 8, 8A, 8B are rectangular in plan view in the above embodiments, the pad body portions 8x, 8y and 8z may be in any polygonal shape other than rectangular in plan view.

In the electrode pad 8, 8A, 8B, the protruding part 10, 10a, 10b, 10c may be larger in width than the interlayer pad portion 9 although the protruding part 10, 10a, 10b, 10c is smaller in width than the interlayer pad portion 9 in the above embodiments. Even in such a case, the above effect (1) can be obtained.

In the package body 2, the back-surface-side ceramic layer c1 may be a laminate of two or more ceramic layers. An inner wiring may be provided at an interlayer surface between these ceramic layers and appropriately connected to the via conductors 11, 12.

A plurality of recessed cavities 5 may be open at the front surface 3 of the package body 2. Further, any of the electrode pads 8, 8A and 8B may be provided in the respective recessed cavities 5.

The cross-sectional shape of the via conductors 11, 12 is not particularly limited. The via conductors 11, 12 can be circular, ellipse, oval or rectangular in cross section.

There is no particular limitation on the kind of the liquid-containing electrolyte used as long as the liquid-containing electrolyte is an electrolyte containing a liquid or gel-like component. For example, the liquid-containing electrolyte contains Na, K, Ca, P, Cl etc. in ionized form. Specific examples of the liquid electrolyte are those in which a lithium salt such as lithium tetrafluoroborate or the like and an acid such as hydrochloric acid, sulfuric acid, nitric acid or the like are dissolved in an organic solvent such as diethoxyethane, propylene carbonate or the like. Specific example of the gel-like electrolyte are those obtained by impregnating a polymer gel or the like with the liquid electrolyte. The polymer gel can be of as polyethylene oxide, poly(methyl methacrylate), poly(vinylidene fluoride) or the like. Alternatively, there can be used an ionic liquid of pyridine, cyclic amine, aliphatic amine, imidazolium etc. or an ambient temperature molten salt such as amidine etc.

A plurality of the ceramic packages 1a may be assembled together into a larger size such that the package assembly has a product part in which multiple ceramic packages 1a are arranged adjacently in rows and columns (in plan view) and a frame-shaped lug part in which multiple ceramic packages 1a are arranged and stacked so as to surround the product part.

The entire contents of Japanese Patent Application No. 2019-003018 (filed on Jan. 11, 2019) and No. 2019-088105 (filed on May 8, 2019) are herein incorporated by reference. The scope of the present invention is defined with reference to the following claims.

The invention claimed is:

1. A ceramic package for filling with a liquid-containing electrolyte, comprising:
  a package body having opposite front and back surfaces and defining therein a recessed cavity open at the front surface of the package body to be filled with the liquid-containing electrolyte, the package body comprising a plurality of ceramic layers including first and second ceramic layers stacked together, the first ceramic layer being located closer to the back surface of the package body than the second ceramic layer, an interlayer surface between the first and second ceramic layers being defined along an extension of a bottom surface of the recessed cavity in a plane direction;
  a plurality of electrode pads disposed on the bottom surface of the recessed cavity and the interlayer surface between the first and second ceramic layers;
  a plurality of outer connection terminals disposed on the back surface of the package body;
  via conductors extending through at least the first ceramic layer and respectively connecting the electrode pads to the outer connection terminals, wherein each of the electrode pads includes a pad body portion having a polygonal shape in plan view and an interlayer pad portion formed along the interlayer surface between the first and second ceramic layers such that a boundary of the pad body portion and the interlayer pad portion is positioned at the interlayer surface between the first and second ceramic layers, wherein the interlayer pad portion has a protruding part protruding outwardly from the pad body portion in plan view, and wherein the via conductors are formed between the protruding parts of the electrode pads and the outer connection terminals through at least the first ceramic layer.

2. The ceramic package according to claim 1,
wherein the package body has a rectangular shape in plan view,
wherein the interlayer pad portion is adjacent to and integral with the pad body portion, and
wherein a width of the protruding part is smaller than a width of the interlayer pad portion except the protruding part in plan view.

3. The ceramic package according to claim 1,
wherein, when viewed in plan, the protruding part has a rectangular shape, a trapezoid-like shape whose wide base side is located opposite from the pad body portion, or a T shape having a linear section located opposite from the pad body portion and in parallel with a side surface of the recessed cavity closest to the protruding part and a narrow neck section located closer to the pad body portion than the linear section.

4. The ceramic package according to claim 1,
wherein two or more of the plurality of outer connection terminals are electrically connected to one of the plurality of electrode pads.

5. The ceramic package according to claim 1,
wherein the plurality of outer connection terminals are arranged on a peripheral region of the back surface of the package body.

6. The ceramic package according to claim 1, further comprising a plurality of side conductors disposed on a side surface of the package body between the front and back surfaces,
wherein side-surface-side ends of the outer connection terminals are respectively connected to back-surface-side ends of the side conductors.

7. The ceramic package according to claim 1, further comprising one or more additional outer connection terminals disposed on a center region of the back surface surrounded by the plurality of outer connection terminals.

* * * * *